United States Patent
Ding et al.

(10) Patent No.: US 10,217,828 B1
(45) Date of Patent: Feb. 26, 2019

(54) TRANSISTORS WITH FIELD PLATES ON FULLY DEPLETED SILICON-ON-INSULATOR PLATFORM AND METHOD OF MAKING THE SAME

(71) Applicant: GLOBALFOUNDRIES Singapore Pte. Ltd., Singapore (SG)

(72) Inventors: Yinjie Ding, Singapore (SG); Eng Huat Toh, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/794,813

(22) Filed: Oct. 26, 2017

(51) Int. Cl.
H01L 29/66 (2006.01)
H01L 29/40 (2006.01)
H01L 29/78 (2006.01)
H01L 21/762 (2006.01)
H01L 29/06 (2006.01)

(52) U.S. Cl.
CPC ...... H01L 29/405 (2013.01); H01L 21/76224 (2013.01); H01L 29/0649 (2013.01); H01L 29/401 (2013.01); H01L 29/66681 (2013.01); H01L 29/7816 (2013.01)

(58) Field of Classification Search
CPC . H01L 29/405; H01L 29/0649; H01L 29/401; H01L 29/66681; H01L 29/7816; H01L 21/76224
USPC .......................................................... 257/339
See application file for complete search history.

(56) References Cited

U.S. PATENT DOCUMENTS

| 6,677,210 B1 * | 1/2004 | Hebert | H01L 29/0847 257/408 |
| 2011/0062489 A1 * | 3/2011 | Disney | H01L 29/1095 257/140 |

OTHER PUBLICATIONS

Xing et al., "High Breakdown Voltage Al GaN-GaN HEMTs Achieved by Multiple Field Plates", IEEE Electron Device Letters, vol. 25, No. 4, Apr. 2004, retrieved on Sep. 13, 2017 from http://escholarship.org/uc/item/8fd521ph, pp. 161-163.
Shrivastava et al., "Part I: Mixed-Signal Performance of Various High-Voltage Drain-Extended MOS Devices", IEEE Transactions on Electron Devices, vol. 57, No. 2, Feb. 2010, retrieved on Sep. 13, 2017 from http://dspace.library.iitb.ac.in/jspui/bitstream/10054/8434/1/Part%20I%20Mixed-Signal%20Performance.pdf, pp. 448-457.
Shrivastava et al., "Part II: A Novel Scheme to Optimize the Mixed-Signal Performance and Hot-Carrier Reliability of Drain-Extended MOS Devices", IEEE Transactions on Electron Devices, vol. 57, No. 2, Feb. 2010, pp. 458-465.

(Continued)

Primary Examiner — Tu-Tu V Ho
(74) Attorney, Agent, or Firm — Ditthavong & Steiner, P.C.

(57) ABSTRACT

A method of forming a bulk transistor integrated with silicon-on-insulator (SOI) field plates, and related device, are provided. Embodiments include forming a silicon-on-insulator (SOI) substrate as a field plate on a field plate oxide; forming a high-voltage p-type well in a p-type substrate of a bulk transistor on which the SOI substrate is formed, the high-voltage p-type formed between shallow trench isolation (STI) region of the p-type substrate; forming an n-drift region in the high-voltage p-type well; forming a first gate on the high-voltage p-type well; and implanting a first n-type region adjacent to the gate as a source region and a second n-type region adjacent to the SOI substrate as a drain region.

18 Claims, 7 Drawing Sheets

(56) References Cited

OTHER PUBLICATIONS

Ludikhuize, "A Review of RESURF Technology", Proceedings of the 12th International Symposium on Power Semiconductor Devices and ICs, IEEE, 2000, pp. 11-18.
Shibib et al., "Control of Hot Carrier Degradation in LDMOS Devices by a Dummy Gate Field Plate: Experimental Demonstration", Proceedings of the 16th International Symposium on Power Semiconductor Devices and ICs, IEEE, 2004, pp. 233-235.
Marbell et al., "Effect of Dummy Gate on Breakdown and Degradation of LDMOSFETs", IEEE Transactions on Device and Materials Reliability, vol. 8, No. 1, Mar. 2008, pp. 193-202.
Wu et al., "30-W/mm GaN HEMTs by Field Plate Optimization", IEEE Electron Device Letters, vol. 25, No. 3, Mar. 2004, pp. 117-119.
Cortes et al., "Optimisation of Low Voltage Field Plate LDMOS Transistors", Proceedings of the Spanish Conference on Electron Devices, Feb. 11-13, 2009, pp. 475-478.
Yin-Chun et al,. "A Low Specific On-Resistance SOI LDMOS with a Novel Junction Field Plate", Chinese Physics B, vol. 23, No. 7, 2014, retrieved on Sep. 13, 2017 from http://cpb.iphy.ac.cn/EN/abstract/abstract60162.shtml#, pp. 077306.1-5.
Kumar et al., "Extended-p+ Stepped Gate (ESG) LDMOS for Improved Performance", IEEE Transactions on Electron Devices, vol. 57, No. 7, 2010, retrieved on Sep. 13, 2017 from https://arxiv.org/ftp/arxiv/papers/1008/1008.2835.pdf, pp. 1719-1724.
Tee et al., "Impact of Poly Field Plate Dimension Towards LDMOS Performance", IEEE International Conference on Semiconductor Electronics, 2008, pp. 436-440.

\* cited by examiner

100

100

100

100

210

200

220

214

TRANSISTORS WITH FIELD PLATES ON FULLY DEPLETED SILICON-ON-INSULATOR PLATFORM AND METHOD OF MAKING THE SAME

TECHNICAL FIELD

The present disclosure relates to semiconductor fabrication. In particular, the present disclosure relates to bulk transistors integrated with silicon-on-insulator (SOI) field plates in advanced technology nodes.

BACKGROUND

Transistors have been continuously scaled down in size to increase performance and reduce power consumption. This has led to the advent of more efficient, scalable electronic devices and increased user experiences. However, as transistors have decreased in size, the complexity of manufacturing them for optimal performance has increased. One area of challenge faced by manufactures of high-voltage transistors is managing breakdown voltage ($V_{br}$). Breakdown is the voltage at which the device is switch-off. The gate at 0V and drain will be at a high bias. $V_{br}$ is the highest voltage that the drain voltage can sustain before breakdown (e.g. impact-ionization). Controlling $V_{br}$ enables manufactures to tailor the transistor to specific switching applications, but is limited by the amount of resistance within the current flow path of the transistor. There is a tradeoff between high $V_{br}$ in the off-state and low resistance in the on-state of the transistor.

One approach for addressing this issue is the use of field plates, small structures that extend the gate of a transistor to increase $V_{br}$. Field plates widen the effective depletion width of the transistor, enabling current to flow less restrictively from a source of the transistor to a drain due to an applied gate voltage stimuli. Unfortunately, the addition of field plates increases the number of process steps required to produce transistors and invariably increases the cost of manufacture.

A need therefore exists for forming field plates on a transistor to improve $V_{br}$ with minimal formation steps, and the resulting device.

SUMMARY

An aspect of the present disclosure is a bulk transistor integrated with a SOI field plate. Another aspect of the present disclosure is a bulk transistor with integration of multiple field plates formed at the same time to reduce manufacturing complexity. Still further, another aspect of the present disclosure includes a transistor with reduced drain-source on resistance ($R_{DS(ON)}$). $R_{DS(ON)}$ represents the total resistance between the source and the drain during the on state.

Further aspects include utilizing a SOI substrate as a field plate and field plate oxide within a bulk transistor to produce a hybrid transistor having lateral diffused metal oxide semiconductor (LDMOS) and fully depleted SOI (FDSOI) characteristics. Another aspect of the present disclosure includes forming additional field plates concurrent with formation of the SOI substrate to reduce process steps. Another aspect of the present disclosure includes forming shallow trench isolation (STI) regions in an n-drift region of the bulk transistor adjacent to the additional field plate and the SOI substrate to reduce the peak electric field further to increase $V_{br}$. Another aspect of the present disclosure includes enabling the SOI substrate to be independently biased, without inhibiting the current architecture of a bulk transistor, to achieve higher breakdown voltage. Still yet, another aspect of the present disclosure includes controlling the doping or lack thereof of the SOI substrate to achieve targeted $V_{br}$, reduce electric field characteristics, perform junction formation, reduce $R_{DS(ON)}$, etc.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a SOI substrate as a field plate on a field plate oxide; forming a high-voltage p-type well in a p-type substrate of a bulk transistor on which the SOI substrate is formed, the high-voltage p-type well formed between STI regions of the p-type substrate; forming an n-drift region in the high-voltage p-type well; forming a first gate on the high-voltage p-type well; and implanting a first n-type region adjacent to the gate as a source region and a second n-type region adjacent to the SOI substrate as a drain region.

Aspects include the SOI substrate including a silicon wafer with a buried oxide insulator. In an additional aspect, the silicon wafer is the field plate and the buried oxide insulator is the field plate oxide for the bulk transistor.

Additional aspects include implanting a p-type region in the high-voltage p-type well between the STI region and the first n-type region. In an additional aspect, the first n-type region is implanted in the high-voltage p-type well. Still further, a second n-type region implanted in the high-voltage p-type well.

Other aspects include forming a second gate as a second field plate on a second field plate oxide, the second field plate adjacent to the SOI substrate and the second n-type region. An additional aspect includes the SOI substrate overlaps the n-drift region, and the second field plate is formed concurrently with the first gate. In yet another aspect, the second gate on the second field plate oxide and the SOI substrate are shorted to the first gate, shorted to the source region, floated, grounded or independently biased.

Further aspects include forming another STI region in the n-drift region. Another aspect includes the first gate overlaps the other STI region. Additional aspects include forming one or more spacers adjacent to the first gate and/or the second gate.

Additional aspects include forming an interlayer dielectric (ILD) over the first n-type region and the second n-type region; performing self-aligned silicidation to reduce resistance in the first n-type region and the second n-type region; forming contacts in the ILD; and performing back-end-of-line (BEOL) processing.

Another aspect of the present disclosure is a device including a SOI substrate formed as a field plate on a field plate oxide; a p-type substrate of a bulk transistor on which the SOI substrate is formed; a high voltage p-type well formed in the p-type substrate; an n-drift region formed in the high-voltage p-type well; a gate formed on the high-voltage p-type well; a first n-type region implanted adjacent to the gate as a source region; and a second n-type region implanted adjacent to the SOI substrate as a drain region.

Other aspects of the SOI substrate of the device of the present disclosure include a silicon wafer; and a buried oxide insulator. In one aspect, the silicon wafer is the field plate and the buried oxide insulator is the field plate oxide.

Other aspects of the present disclosure include a device including STI regions formed in the p-type substrate surrounding the high-voltage p-type well. In one aspect, the high-voltage p-type well is formed between the STI regions and the STI regions are formed prior to the high-voltage p-type well. In another aspect of the present disclosure, the device includes another STI region formed in the n-drift region. In one aspect, the gate overlaps the other STI region.

In yet another aspect, the present disclosure includes a p-type region formed in the high-voltage p-type well between an STI region and the first n-type region. An additional aspect includes the first n-type region is implanted in the high-voltage p-type well and the second n-type region is implanted in the high-voltage p-type well.

Additional aspects of the present disclosure include a device including an interlayer dielectric (ILD) over the first n-type region and the second n-type region and contacts in the ILD.

Further aspects of the present disclosure is a device including a silicon-on-insulator (SOI) substrate formed as a first field plate on a first field plate oxide; a p-type substrate of a bulk transistor on which the SOI substrate is formed; a first gate formed on a high-voltage p-type well of the p-type substrate; a second field plate oxide formed adjacent to the SOI substrate on a n-drift region of the high-voltage p-type well; and a second gate formed on the second field plate oxide as a second field plate. In one aspect of the invention, the second gate and the first field plate oxide are formed concurrent with the SOI substrate.

Other aspects of the SOI substrate of the device of the present disclosure include a silicon wafer. In another aspect, the SOI substrate includes a buried oxide insulator. In one aspect, the silicon wafer is the field plate and the buried oxide insulator is the field plate oxide.

In another aspect of the present disclosure, the device further includes a first n-type region implanted adjacent to the gate as a source region. In another aspect, the device further includes a second n-type region implanted adjacent to the SOI substrate as a drain region. In yet another aspect, the device includes an interlayer dielectric (ILD) over the first n-type region and the second n-type region and contacts in the ILD.

Additional aspects and technical effects of the present disclosure will become apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of forming field plates within a transistor to improve $V_{br}$ with minimal processing steps. In accordance with embodiments of the present disclosure, a bulk transistor is integrated with SOI field plates. FIGS. 1A through 1D schematically illustrate cross-sectional views of a bulk transistor integrated with SOI field plates, in accordance with exemplary embodiments.

For the purpose of illustration, a bulk transistor includes a transistor formed according to known bulk manufacturing and/or design techniques. Also, the field plates as described herein include those formed according to known SOI or FDSOI. As such, the transistors presented in FIG. 1A-1D depict a hybrid transistor device that integrates aspects of bulk and SOI/FDSOI design principles for streamlined fabrication of the transistor and enhanced management of breakdown voltage $V_{br}$ and $R_{DS(ON)}$ It is contemplated that other known and newly developed microprocessor design methodologies may also be employed.

Still other aspects, features, and technical effects will be apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
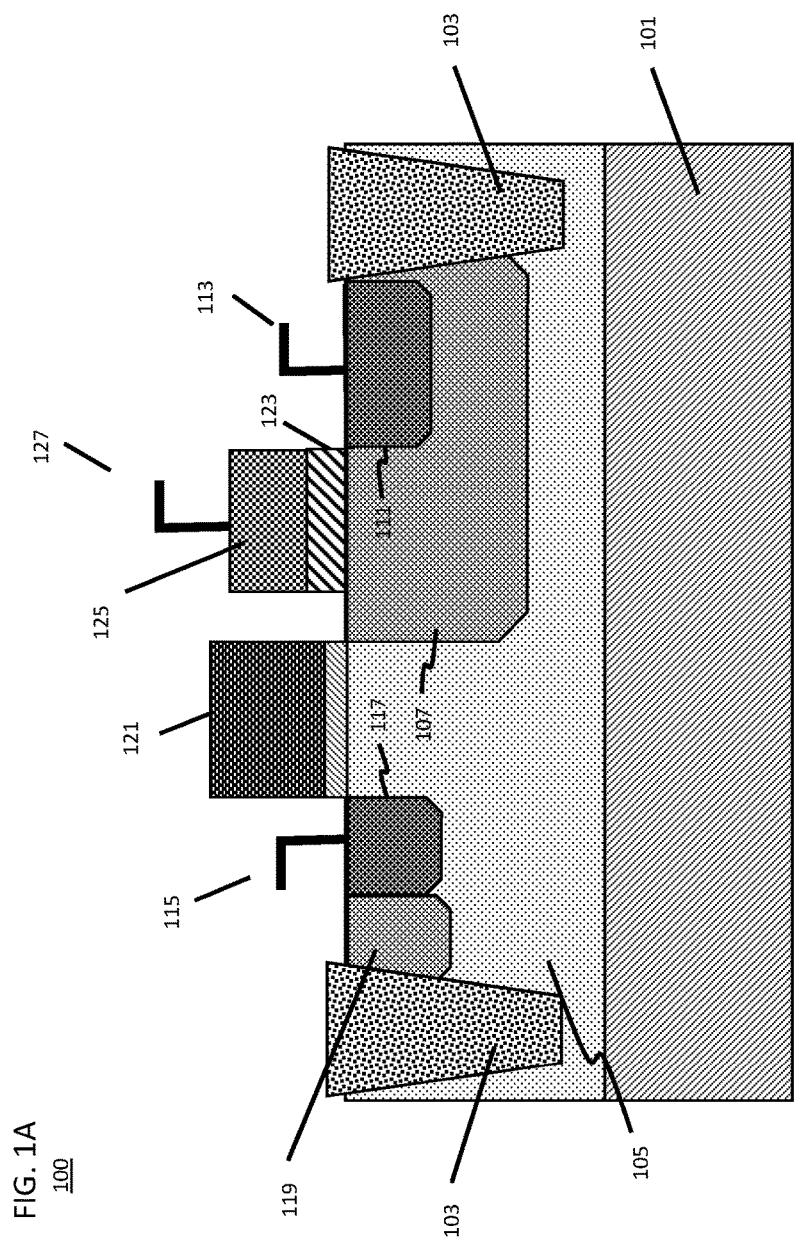
FIGS. 1A through 1D schematically illustrate cross-sectional views of a bulk transistor integrated with SOI field plates, in accordance with exemplary embodiments.

Adverting to FIG. 1A, a cross-sectional view of a transistor 100 is provided. The transistor 100 includes a p-type substrate 101 upon which various elements are formed internally (within the body of the transistor 100) and externally on and/or adjacent to the body of the transistor 100). While not shown for illustrative convenience, an n-epitaxial growth layer may be formed in connection with the p-type substrate 101 for enabling implantation of various dopants. By default, the n-epitaxial growth layer is not present, but can be included.

The transistor 101 may include an isolation structure formed as STI regions 103. The STI region 103 extends from the surface of the transistor 100 into the p-type substrate 101. For this example, the STI region 103 is formed near the edges of the transistor, and surrounds a high-voltage p-type well (HVPWELL) 105. The HVPWELL 105 can be deeper than the STI region 103, as shown in at least FIG. 1A. The HVPWELL 105 depicts a diffused p-type doped region of the transistor 100 for forming various internal well structures, channels and the like.

A n-drift region 107 is formed within the HVPWELL 105 as a thick, n-type doped region at the drain side of the transistor 100. The n-drift region 107 extends the depletion region existing between a source region and drain region of the transistor 100. In certain embodiments, the n-drift region 107 can be formed by well implant or as an epitaxial growth within the HVPWELL 105. The n-drift region 107 is used for lowering the electric field build-up at a drain 113 and minimizing hot-carrier effects of the transistor 100. The drain 113 is formed as a n-type region 111 (dopant). By way of example, the drain 113 may include a contact and/or terminal (not shown for illustrative purposes) for enabling the measurement of current flow/voltage potential from a source 115 to the drain 113.

The source 115 is formed as another n-type region 117 implanted in the HVPWELL 105. Adjacent to the n-type region 117 is a p-type region 119 that is further encompassed by the STI 103, resulting in formation of a p-n junction at the source side of the transistor 100. By way of example, the source 115 may include a contact and/or terminal (not shown for illustrative purposes) for enabling the measurement of current flow/voltage potential from the source 115 to the drain 113. The n-type region 117 and p-type region 119 are shorted with the source 115.

Externally, a metal (or poly-crystalline) gate 121 is formed on the transistor 100. The gate 121 covers the region between the source 115 and the drain 113. The gate 121 is electrically separated from the semiconductor by a gate oxide on which it rests, which is not labeled for illustrative convenience but depicted as the region just below the gate 121. The gate 121 may optionally include one or more spacers (not shown for illustrative convenience) that surround the gate 121 for isolating the gate 121 from the source 115 and a field plate 127. The flow of electrons from the source 115 to the drain 113 is controlled by the voltage applied to the gate 121.

As noted previously, the n-drift region 107 within the transistor 100 body is employed to increase $V_{br}$ by sustaining a larger depletion width/voltage drop between the source 115 and drain 113. However, the drawback of the n-drift region 107 is higher $R_{DS(ON)}$ due to the presence of the low doping in the drift region. The $R_{DS(ON)}$—total resistance from path to drain when the transistor 101/gate 121 is on—is the summation of resistances within the current path, given as:

$$R_{DS(ON)} = R_s + R_{ch} + R_d$$

where, $R_S$=the resistance of the p-type substrate 101 itself;
$R_{CH}$=the resistance of a channel region (e.g., between source 115 and drain 113)
$R_D$=the resistance of the n-drift region 107

To overcome excessive $R_{DS(ON)}$ and increase $V_{br}$, a field plate can be added to extend the gate 121. The field plate typically sits on a thicker oxide above the n-epitaxial layer or above the n-drift region, and helps widen the depletion width/reduce the peak electric field at the surface of the n-drift region 107. In the exemplary embodiments, the field plate is formed on the transistor 101 above the n-drift region 107 as an SOI substrate 127.

The SOI substrate 127 includes a buried oxide (BOX) insulator 123 on which a silicon wafer, referred to herein as SOI 125, rests. The SOI 125 is formed as a field plate for interfacing with the gate 121 while the BOX insulator 123 is formed as the field plate oxide. Thus, the SOI substrate 127 serves as a traditional field plate to increase the depletion width of the transistor 101 and/or makes the drain 113 less n-doped to achieve higher $V_{br}$.

In certain embodiments, the SOI substrate 127 may be selectively doped during the fabrication process to achieve higher work function. For example, the SOI 125 may be p-doped to further reduce electric field in the n-drift region 107 to widen the depletion width. The formation of SOI substrate 127 is performed first, and then then the gate 121 is formed. The second field plate 135 can be formed at the same time as gate 121. For example, the SOI substrate 127 is provided and then STI regions are formed. A hybrid SOI formation is performed to etch away unwanted SOI and BOX for the gate and S/D region which forms the field plate. The HVPWELL and drift region are formed and then gate 121 is formed, followed by spacer formation and S/D regions. Similarly, an etching process of the SOI 125 may be performed in conjunction etching of the gate poly-crystalline with the gate oxide. In other examples, an SOI substrate is provided and etched to form the bulk region. Etching of the SOI substrate to reveal bulk region is preferred.

Figure 1B:
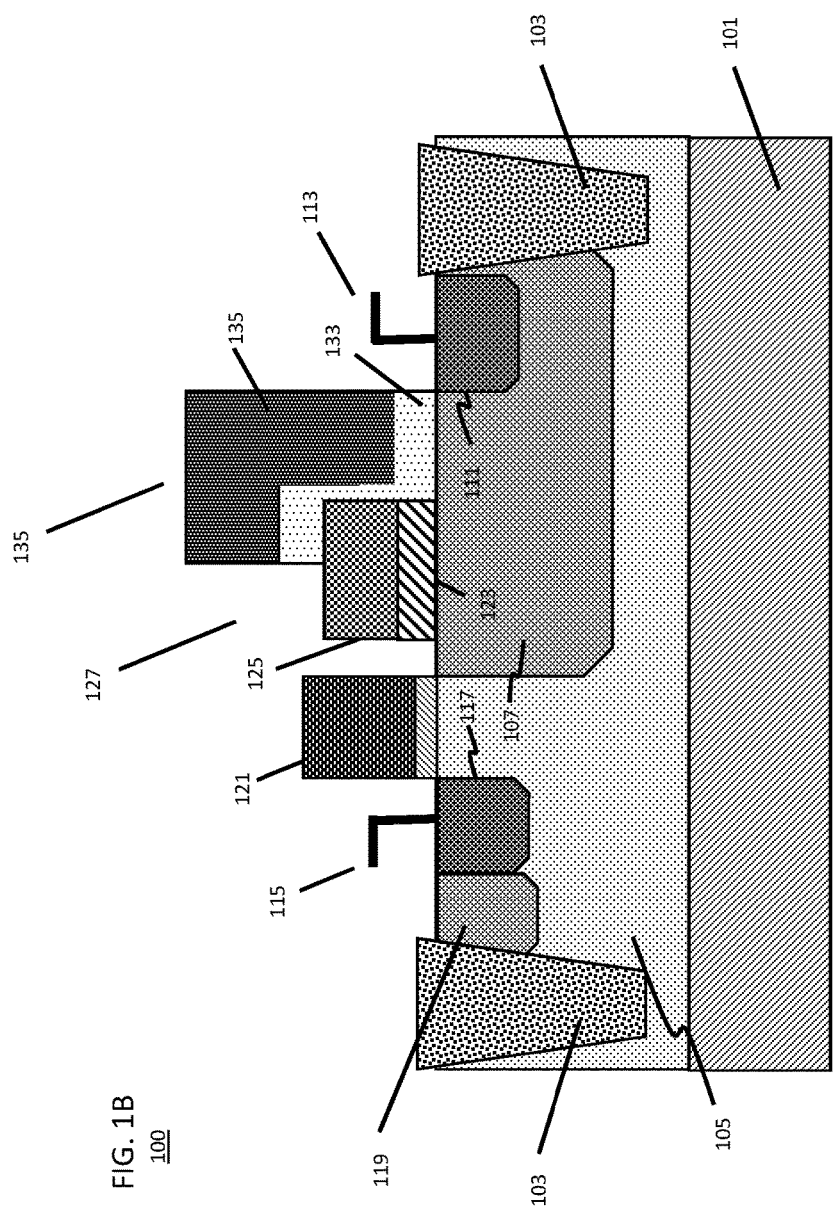

Adverting to FIG. 1B, an alternate embodiment of the cross-sectional view of the transistor 100 is provided. In this embodiment, a second gate 135 is formed as another field plate next to and in contact with the first field plate, SOI substrate 127 serving as the field plate. The second gate is formed as the other field plate on another field plate oxide 133.

The field plate oxide 113 is formed at the same time as the gate 121 oxide or can be formed by itself. In another example, the first gate 121 and second gate 135 formed as the field plate 131 may be formed concurrently. In this example, the first gate 121 and second 135 are formed of the same polysilicon. Further, the oxide under gate 121, such as HVOX, is formed at the same time as field plate oxide 133. Thus, the hybrid transistor 100 is fully formed per this implementation with only one extra masking step as opposed to multiple masking steps. In certain embodiments, field plate 135 is formed at the same time as the transistor gate 121.

Figure 1C:
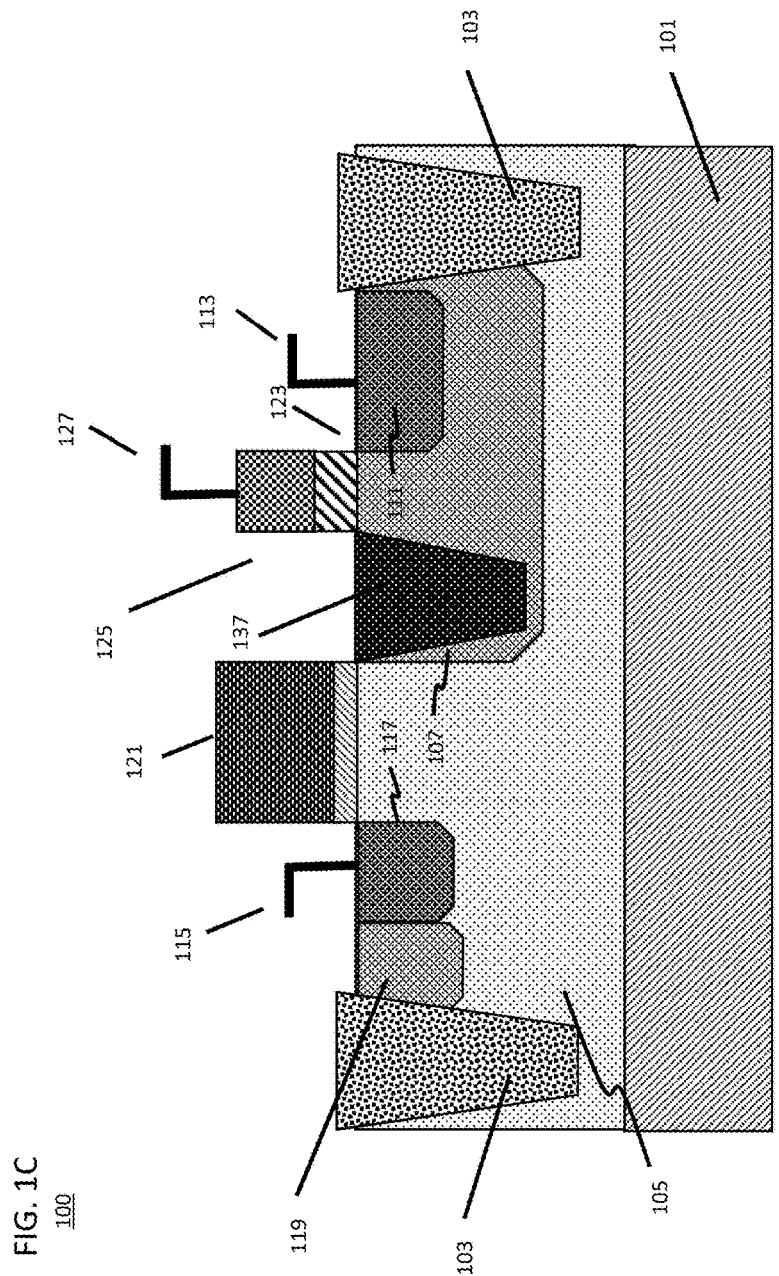

Adverting to FIG. 1C, an alternate embodiment of the cross-sectional view of the transistor 100 is provided. In this embodiment, another STI region 137 is formed in the n-drift region 107 of the transistor 101. This helps to isolate the transistor channel from the highly-biased drain 113, which reduces the peak electric field at the HVPWELL 105/n-junction. This approach again results in a higher $V_{br}$.

Figure 1D:
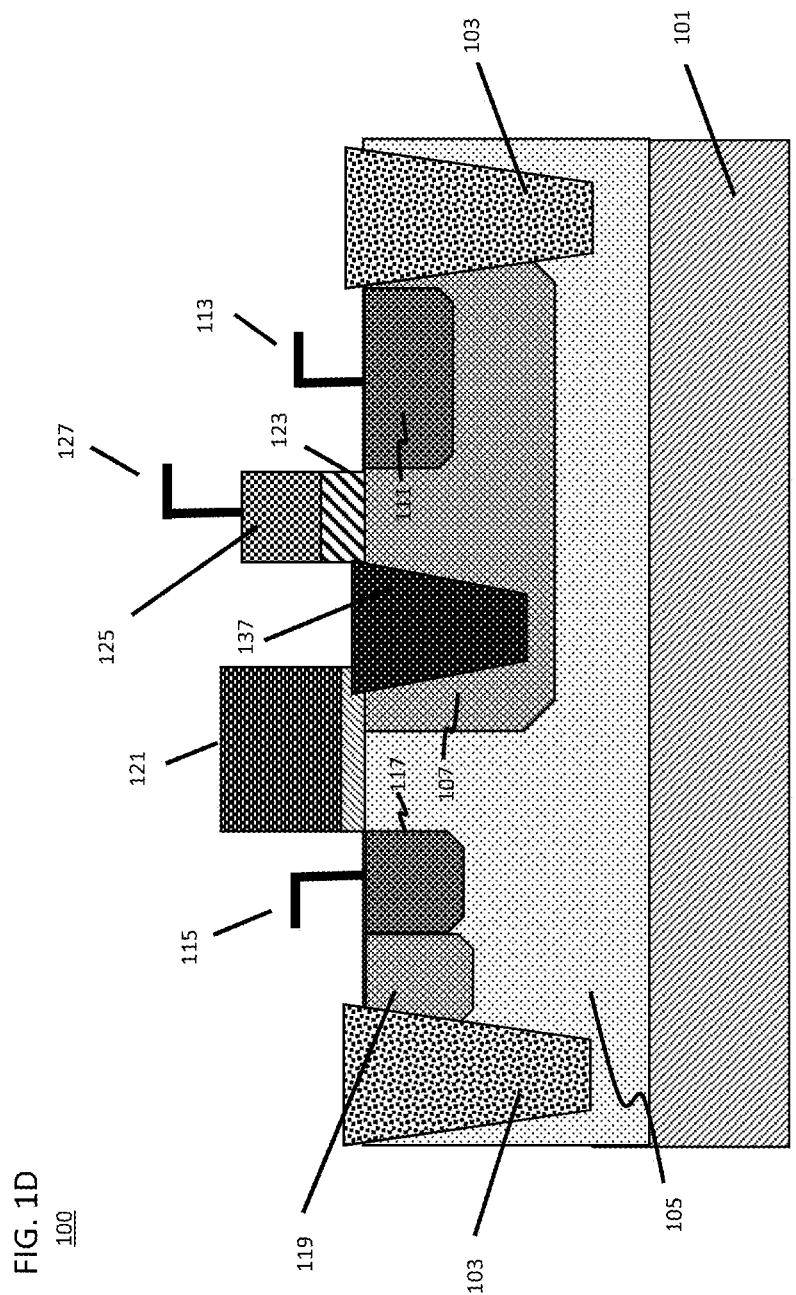
Figure 2B:
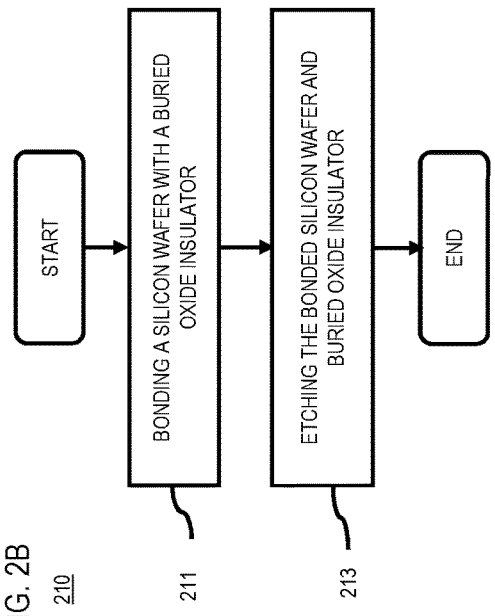
FIGS. 2A through 2E are flowcharts of a process for forming a bulk transistor integrated with SOI field plates, in accordance with exemplary embodiments.
Figure 2A:
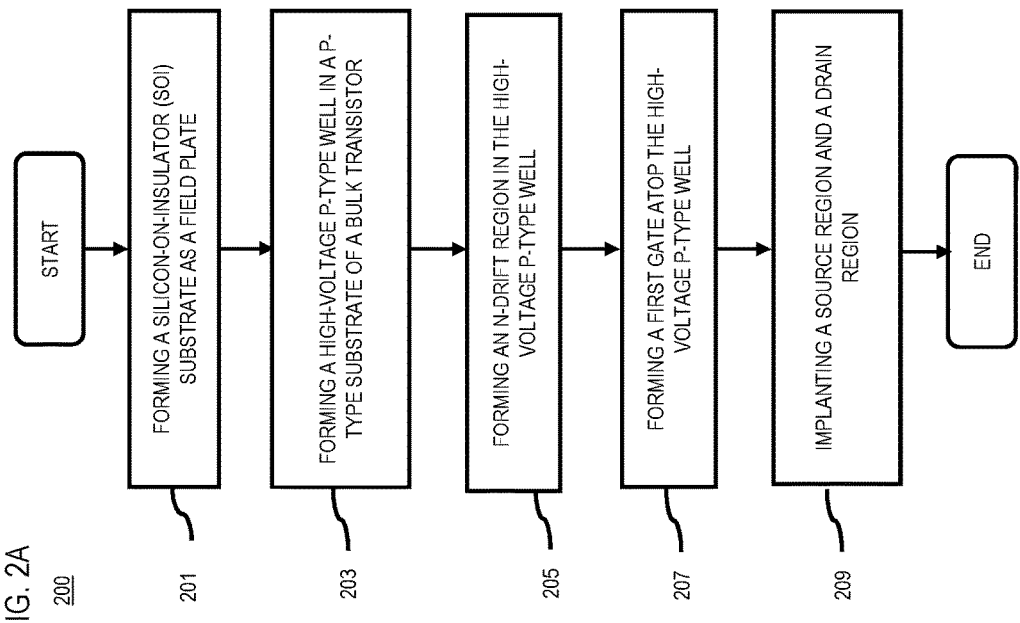
Figure 2D:
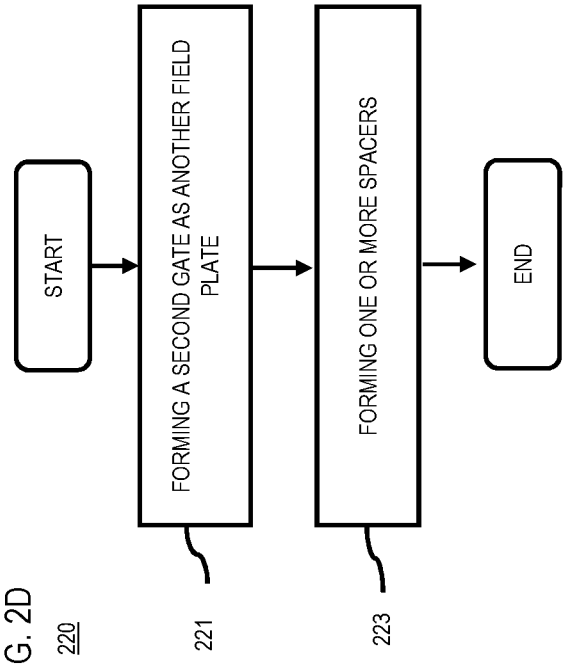
Figure 2C:
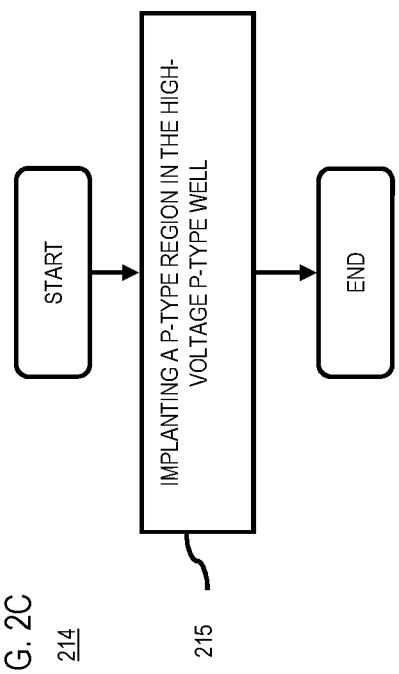
Figure 2E:
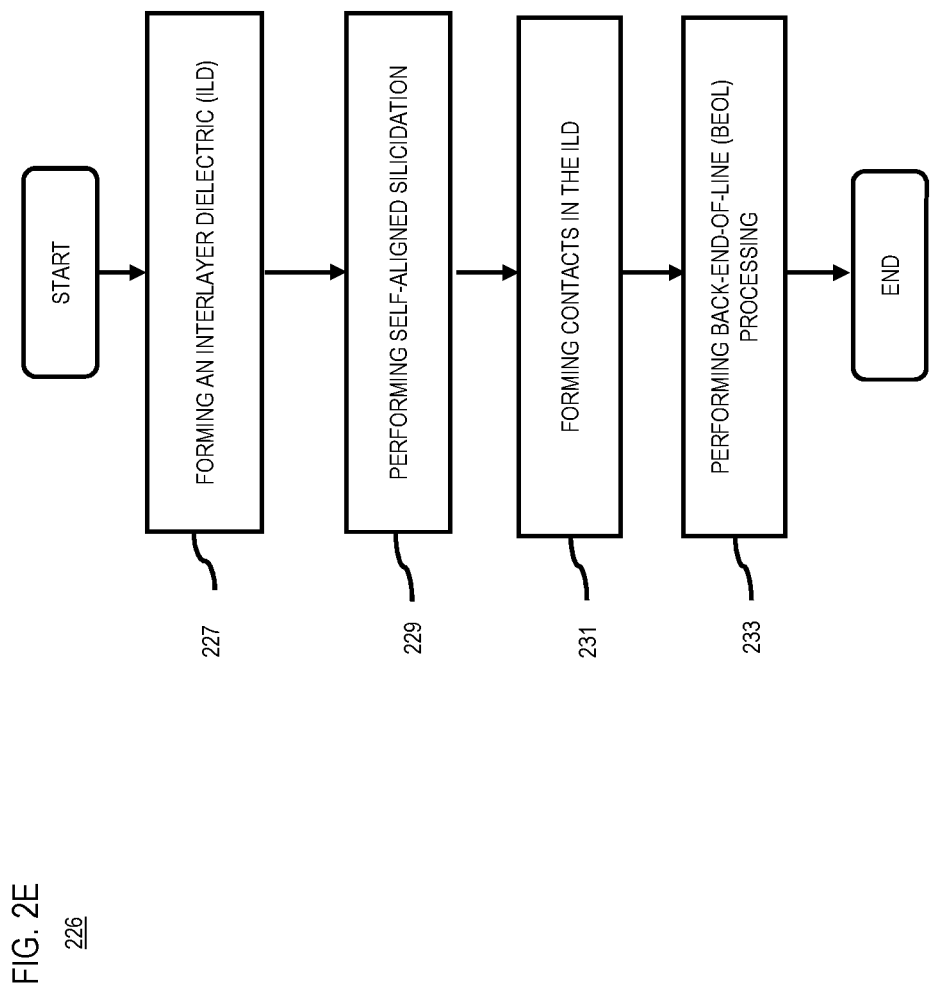

Adverting to FIG. 1D, an alternate embodiment of the cross-sectional view of the transistor 100 is provided. In this embodiment, the first gate overlaps on the second STI 137 formed within the n-drift region 107, forming an extended first gate 121a. Extending the first gate reduces the electric field at the second STI 137 corner region, resulting again in a higher $V_{br}$.

As noted previously, the gates 121 and 121 of FIGS. 1C and 1D respectively may be formed concurrent with the field plates 135. STI 137 is formed to a different depth than STI region 103 and therefore normally formed separately. The exemplary embodiments presented in FIGS. 1C and 1D result in formation of a hybrid transistor 100—one with bulk and SOI/FDSOI elements—that is fully formed with no extra masking step.

FIGS. 2A through 2E are flowcharts of a process for forming a bulk transistor integrated with silicon-on-insulator (SOI) field plates, in accordance with exemplary embodiments. The process steps herein may be performed in accordance with any known device or microprocessor manufacturing, design or fabrication procedure and may be performed in different order. The steps as performed, in whole or in part, to result in the formation of a hybrid transistor formulated based on bulk and SOI/FDSOI methodologies to enhance $V_{br}$ performance, streamline production and reduce development complexity.

In step 201 of process 200 (FIG. 2A), a SOI substrate is formed as a field plate on a field plate oxide. In another step 203, a high-voltage p-type well is formed in a p-type substrate of a bulk transistor on which the SOI substrate is formed. The high-voltage p-type well is surrounded by a STI region of the p-type substrate. In another step 205, an n-drift region is formed in the high-voltage p-type well. The n-drift region extends the depletion region existing between a source region and a drain region of the hybrid transistor. The p-type well and n-drift region can be formed before the etching of SOI substrate 127. After implantation, then the SOI field plate is etched and formed.

In another step 207, a first gate is formed on the high-voltage p-type well. In yet another step 209, a first n-type region is implanted adjacent to the gate as a source region and a second n-type region is implanted adjacent to the SOI substrate as a drain region.

Steps 211 and 213 of process 210 (FIG. 2B) correspond to steps taken for formation of the SOI substrate of process step 201 of process 200. In step 211, a silicon wafer is bonded with a buried oxide insulator. In another step 213, the bonded silicon wafer and buried oxide insulator are etched. In alternative examples, the SOI substrate can be provided without any additional bonding being required (i.e., purchased as is). As discussed previously, the silicon wafer is the field plate and the buried oxide insulator is the field plate oxide. This underscores the flexibility of the microprocessor formation approach outlined in the embodiments presented herein, as SOI/FDSOI technology may be incorporated for use upon, or to directly produce, traditional bulk technology design elements accordingly.

In step 215 of process 214 (FIG. 2C), a p-type region is implanted in the high voltage p-type well between the STI region and the first n-type region. The first n-type region is implanted in the high voltage p-type well.

In step 221 of process 220 (FIG. 2D), a second gate is formed as another field plate on another field plate oxide, the other field plate adjacent to the SOI substrate and the second n-type region. The other field plate is formed by poly, and therefore formed at the same time as gate 121. Per this step, the SOI substrate overlaps the n-drift region. The second gate is formed concurrent with gate 121. As noted previously, this underscores the convenience of the microprocessor formation approach presented in the embodiments herein, as concurrent production of transistor elements and features reduces fabrication time and effort. Furthermore, the number of masking steps is significantly reduced.

Still further, per step 221, the second gate is formed on the other field plate oxide. Also, the other field plate oxide and the SOI substrate are shorted to the first gate, shorted to the source region, floated, grounded or independently biased. This underscores yet another advantage of the embodiments presented herein, as independent biasing of the field plates helps achieve higher $V_{br}$. Moreover, the SOI substrate may be n-type or p-type doped based on application and/or performance requirements sought to be achieved via the hybrid transistor. For example, the SOI substrate can be doped to form a junction field plate (JFP), such as P+P–N+ JFP, resulting in higher $V_{br}$ and/or lower $R_{DS(ON)}$.

One or more spacers are also formed adjacent to the first gate and/or the second gate, corresponding to step 223. STI regions help isolate the channel from the effects of a highly-biased drain. This reduces the peak electric field at the HVPWELL/n-junction and increases $V_{br}$. Also, it was noted that the first gate may overlap the other STI region corresponding to an extended formation of the first gate. Overlapping the gate on the STI reduces the electric field at the STI corner region, thus increasing the Vbr.

In step 227 of process 226 (FIG. 2E), an interlayer dielectric (ILD) is formed over the first n-type region and the second n-type region. In step 229, self-aligned silicidation is performed to reduce resistance in the first n-type region and the second n-type region. In steps 231 and 233 respectively, contacts are formed in the ILD and back-end-of-line (BEOL) processing is performed.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices. The present disclosure is particularly applicable in semiconductor devices in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a silicon-on-insulator (SOI) substrate as a field plate on a field plate oxide;
   forming a high-voltage p-type well in a p-type substrate of a bulk transistor on which the SOI substrate is formed, the high-voltage p-type well formed between shallow trench isolation (STI) regions of the p-type substrate;
   forming an n-drift region in the high-voltage p-type well;
   forming a first gate on the high-voltage p-type well; and
   implanting a first n-type region adjacent to the gate as a source region and a second n-type region adjacent to the SOI substrate as a drain region,
   wherein the SOI substrate comprises a silicon wafer with a buried oxide insulator, wherein the silicon wafer is the field plate and the buried oxide insulator is the field plate oxide.

2. The method according to claim 1, further comprising:
   implanting a p-type region in the high-voltage p-type well between an STI region and the first n-type region,
   wherein the first n-type region is implanted in the high-voltage p-type well.

3. The method according to claim 1, wherein the second n-type region is implanted in the high-voltage p-type well.

4. The method according to claim 1, further comprising:
   forming a second gate as a second field plate on a second field plate oxide, the second field plate adjacent to the SOI substrate and the second n-type region,
   wherein the SOI substrate overlaps the n-drift region, and the second field plate is formed concurrently with the first gate.

5. The method according to claim 4, wherein the second gate is formed on the second field plate oxide and the SOI substrate are shorted to the first gate, shorted to the source region, floated, grounded or independently biased.

6. The method according to claim 1, further comprising:
forming another STI region in the n-drift region,
wherein the first gate overlaps the other STI region.

7. The method according to claim 4, further comprising:
forming one or more spacers adjacent to the first gate and/or the second gate.

8. The method according to claim 1, further comprising:
forming an interlayer dielectric (ILD) over the first n-type region and the second n-type region; and
performing self-aligned silicidation to reduce resistance in the first n-type region and the second n-type region.

9. The method according to claim 8, further comprising:
forming contacts in the ILD; and
performing back-end-of-line (BEOL) processing.

10. A device comprising:
a silicon-on-insulator (SOI) substrate formed as a field plate on a field plate oxide;
a p-type substrate of a bulk transistor on which the SOI substrate is formed;
a high voltage p-type well formed in the p-type substrate;
an n-drift region formed in the high-voltage p-type well;
a gate formed on the high-voltage p-type well;
a first n-type region implanted adjacent to the gate as a source region; and
a second n-type region implanted adjacent to the SOI substrate as a drain region,
wherein the SOI substrate further comprises:
a silicon wafer; and
a buried oxide insulator,
wherein silicon wafer is the field plate and the buried oxide insulator is the field plate oxide.

11. The device according to claim 10, further comprising:
shallow trench isolation (STI) regions formed in the p-type substrate surrounding the high-voltage p-type well; and
another STI region formed in the n-drift region,
wherein the STI regions are formed prior to the high-voltage p-type well.

12. The device according to claim 11, wherein the gate overlaps the other STI region.

13. The device according to claim 10, further comprising:
a p-type region formed in the high-voltage p-type well between an STI region and the first n-type region,
wherein the first n-type region is implanted in high-voltage p-type well and the second n-type region is implanted in the high-voltage p-type well.

14. The device according to claim 10, further comprising:
an interlayer dielectric (ILD) over the first n-type region and the second n-type region; and
contacts in the ILD.

15. A device comprising:
a silicon-on-insulator (SOI) substrate formed as a first field plate on a first field plate oxide;
a p-type substrate of a bulk transistor on which the SOI substrate is formed;
a first gate formed on a high-voltage p-type well of the p-type substrate;
a second field plate oxide formed adjacent to the SOI substrate on a n-drift region of the high-voltage p-type well; and
a second gate formed on the second field plate oxide as a second field plate,
wherein the second gate and the first field plate oxide are formed concurrent with the SOI substrate.

16. The device according to claim 15, wherein the SOI substrate further comprises:
a silicon wafer; and
a buried oxide insulator,
wherein silicon wafer is the first field plate and the buried oxide insulator is the first field plate oxide.

17. The device according to claim 15, further comprising:
a first n-type region implanted adjacent to the gate as a source region; and
a second n-type region implanted adjacent to the SOI substrate as a drain region.

18. The device according to claim 15, further comprising:
an interlayer dielectric (ILD) over the first n-type region and the second n-type region; and
contacts in the ILD.

* * * * *